(12) United States Patent
Tracy et al.

(10) Patent No.: US 7,928,326 B2
(45) Date of Patent: Apr. 19, 2011

(54) THERMOFORMED EMI SHIELD

(75) Inventors: Mark S Tracy, Tomball, TX (US); Jeffrey A Lev, Tomball, TX (US); Paul N Walker, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 273 days.

(21) Appl. No.: 12/394,884

(22) Filed: Feb. 27, 2009

(65) Prior Publication Data

US 2010/0218987 A1 Sep. 2, 2010

(51) Int. Cl.
*H05K 9/00* (2006.01)

(52) U.S. Cl. ......... 174/382; 174/384; 174/394; 361/818

(58) Field of Classification Search .................. 174/382, 174/384, 394; 361/816, 818
See application file for complete search history.

(56) References Cited

U.S. PATENT DOCUMENTS

| | | | |
|---|---|---|---|
| 4,670,347 A | 6/1987 | Lasik et al. | |
| 4,785,136 A * | 11/1988 | Mollet et al. | 174/363 |
| 4,965,408 A | 10/1990 | Chapman et al. | |
| 5,170,009 A * | 12/1992 | Kadokura | 174/363 |
| 5,259,792 A | 11/1993 | Beck et al. | |
| 5,260,128 A | 11/1993 | Ishii et al. | |
| 5,286,318 A | 2/1994 | Sims et al. | |
| 5,374,779 A | 12/1994 | Konishi | |
| 5,527,989 A | 6/1996 | Leeb | |
| 5,652,410 A | 7/1997 | Hobbs et al. | |
| 5,676,812 A * | 10/1997 | Kadokura | 205/50 |
| 5,696,196 A | 12/1997 | DiLeo | |
| 5,704,117 A * | 1/1998 | Mok et al. | 29/841 |
| 5,774,344 A | 6/1998 | Casebolt | |
| 6,090,728 A | 7/2000 | Yenni, Jr. et al. | |
| 6,294,730 B1 * | 9/2001 | Holmberg et al. | 174/390 |
| 6,410,847 B1 | 6/2002 | Allen et al. | |
| 6,768,654 B2 * | 7/2004 | Arnold et al. | 361/818 |
| 6,849,800 B2 * | 2/2005 | Mazurkiewicz | 174/394 |
| 6,972,366 B2 * | 12/2005 | Yen et al. | 174/394 |
| 7,005,573 B2 | 2/2006 | Lionetta et al. | |
| 7,488,901 B2 * | 2/2009 | Arnold | 174/377 |
| 2003/0193794 A1 * | 10/2003 | Reis et al. | 361/816 |
| 2007/0199738 A1 * | 8/2007 | Gabower | 174/350 |
| 2009/0108985 A1 * | 4/2009 | Haag et al. | 338/248 |

* cited by examiner

*Primary Examiner* — Hung V Ngo

(74) *Attorney, Agent, or Firm* — Michael S. Czarnecki

(57) ABSTRACT

Systems and methods for minimizing the transmission and reception of electromagnetic interference ("EMI") are provided. A member having first and second sides and at least one edge can be formed to correspond to the interior of an enclosure. At least one aperture can penetrate the member from the first side to the second side, forming at least one internal edge. A conductive layer can be disposed on or about the first side, the second side, the at least one edge, and the at least one internal edge of the member, thereby encapsulating the member.

15 Claims, 3 Drawing Sheets

THERMOFORMED EMI SHIELD

BACKGROUND OF THE INVENTION

Description of the Related Art

This section is intended to introduce the reader to various aspects of art which may be related to one or more aspects of the present invention as described and claimed below. This discussion is believed helpful in providing the reader with background information, thereby facilitating a better understanding of various aspects of the present invention. Accordingly, it should be understood by the reader that the provided information should be read in this light and not as an admission of any prior art.

Electronic devices generate unwanted radio frequencies that, when emitted from the device, can cause electromagnetic interference ("EMI") with other nearby electronic devices. The emission of unwanted EMI from electronic devices can interfere with the reception of broadcast signals, including radio and television signals. The emission of EMI is therefore strictly regulated by the Federal Communications Commission ("FCC") in the United States, and by similar regulatory bodies worldwide. Many electronic devices are enclosed in plastic or similar polymeric enclosures offering little protection against EMI emission. To minimize the emission of unwanted EMI emissions from the electronics disposed within the enclosure, EMI shields covering all or a portion of the electronics are often disposed within the enclosure housing the electronic device.

SUMMARY OF THE INVENTION

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

A system for minimizing the transmission and reception of electromagnetic interference ("EMI") is provided. A member having first and second sides and at least one edge can be formed to correspond to the interior of an enclosure. At least one aperture can penetrate the member from the first side to the second side, forming at least one internal edge. A conductive layer can be disposed on or about the first side, the second side, the at least one edge, and the at least one internal edge of the member, thereby at least partially encapsulating the member.

A method for minimizing the transmission and reception of electromagnetic interference ("EMI") is also provided. A member having first and second sides and at least one edge can be formed into a shape defined by the interior surfaces of an enclosure. At least one or more apertures, penetrating from the first side to the second side of the member can be disposed in, on, or about the member. The aperture can have at least one internal edge. The member can be at least partially encapsulated with a conductive layer disposed partially or completely on or about the first side, the second side, the one or more edges, and the one or more internal edges of the member.

As used herein, the term "conductor" and "conductors" can refer to any device, member and/or conduit suitable for the transmission of an electric current. The electric current can include, but is not limited to, direct current, alternating current, or any combination thereof. Conductors are not limited by form or media and can include, for example, uninsulated conductors, solid conductors, multi-strand conductors, insulated conductors, flat conductors disposed in, on, or about, one or more layers on one or more circuit boards, or any functionally equivalent combination thereof. The conductors can be fabricated from any one or more conductive materials presently known to the art, or known to the art in the future. The conductors can include one or more superconducting materials.

As used herein, the term "coupled" can refer to any form of electrically conductive or magnetically inductive connection linking two or more devices. The connection can be electrically conductive, for example using one or more conductors such as copper or aluminum wire, conductive strips on a printed circuit board, or the like to connect two or more components. The connection can be magnetically inductive, for example, stimulating the flow of current from a transformer secondary coil by passing a current through a primary coil inductively coupled to the secondary coil.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Advantages of one or more disclosed embodiments may become apparent upon reading the following detailed description and upon reference to the drawings in which.

DETAILED DESCRIPTION

A detailed description will now be provided. Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims. Each of the inventions will now be described in greater detail below, including specific embodiments, versions and examples, but the inventions are not limited to these embodiments, versions or examples, which are included to enable a person having ordinary skill in the art to make and use the inventions, when the information in this patent is combined with available information and technology.

Figure 1A:
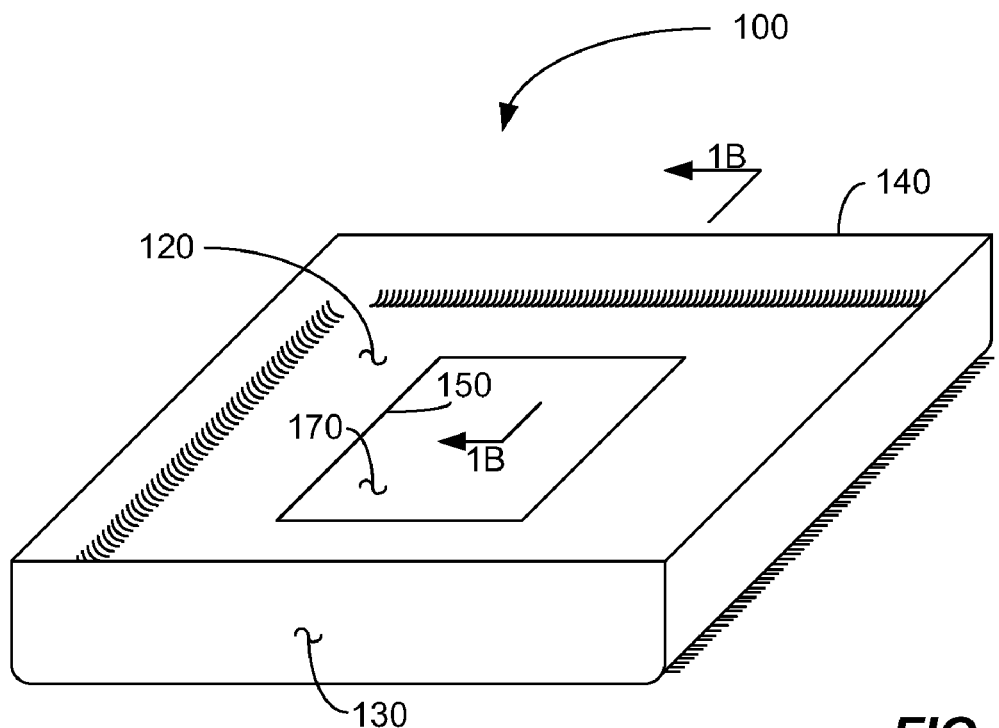
FIG. 1A is a perspective view depicting an illustrative system for minimizing the transmission and reception of electromagnetic interference ("EMI"), according to one or more embodiments described.
Figure 1B:
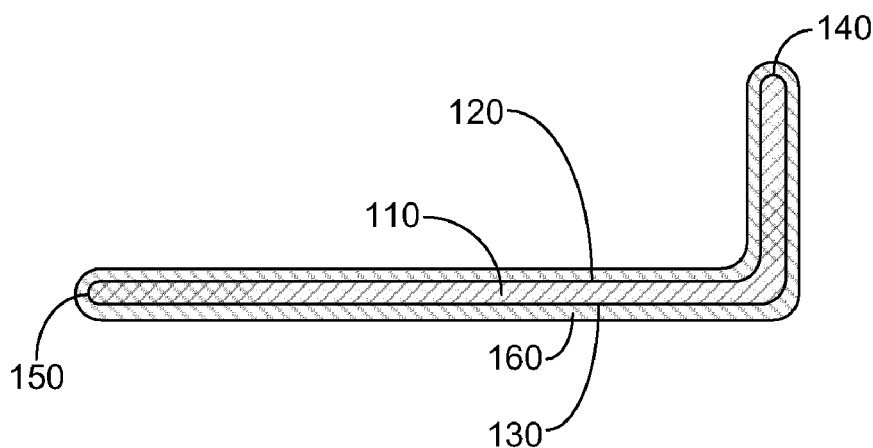
FIG. 1B is a partial cross-sectional view along line 1B-1B of the illustrative system for minimizing the transmission and reception of electromagnetic interference ("EMI") depicted in FIG. 1A, according to one or more embodiments described.

FIG. 1A is a perspective view depicting an illustrative system 100 for minimizing the transmission and reception of electromagnetic interference ("EMI"), according to one or more embodiments. FIG. 1B is a partial cross-sectional view along line 1B-1B of the illustrative system 100 for minimizing the transmission and reception of electromagnetic interference ("EMI") depicted in FIG. 1A, according to one or more embodiments. In one or more embodiments, the system 100 can include a member 110 having a first surface 120, a second surface 130, and at least one edge 140. One or more apertures 170 can be disposed in, on, or about the member 110, providing one or more internal edges 150 on the member 110. In one or more embodiments, a conductive layer 160 can be disposed on or about the first surface 120, the second surface 130, the at least one edge 140, and the one or more internal edges 150. In one or more specific embodiments, the conductive layer 160 can partially encapsulate all or a portion of the member 110. In one or more specific embodiments, the conductive layer 160 can completely encapsulate all or a portion of the member 110.

The member 110 can be a thermoplastic material having any shape or geometry. In one or more embodiments, the member 110 can be a high molecular weight polymer, suitable for repeated heating and cooling cycles. In one or more embodiments, the member 110 can have a first side 120, a second side 130, and at least one edge 140. In one or more embodiments, the thermoplastic material used to form the member 110 can include, but is not limited to, acrylonitrile butadiene styrene (ABS), acrylic (PMMA), fluoroplastics (PTFE), polyethylene terephthalate (PET), polycarbonate (PC), polyhydroxyalkanoate (PHA), polyethylene (PE), polyetheretherketone (PEEK), polyethylenechlorinates (PEC), polypropylene (PP), polystyrene (PS), polyurethane (PU), polyvinylchloride (PVC), polyvinylidene chloride (PVDC), and the like.

The member 110 can be thermoformed using either pressure forming or vacuum forming to provide a three dimensional member 110 such as the EMI shield 100 depicted in FIG. 1. In one or more embodiments, the member can be thermoformed by heating the member 110 to an appropriate temperature and pressing the heated member 110 onto a mold at a pressure equal to or greater than atmospheric pressure, i.e. pressure formed. In one or more embodiments, the member can be thermoformed by heating the member 110 to an appropriate temperature and inducing the heated member 110 to flow in, on, or about a mold at a pressure less than atmospheric pressure, i.e. vacuum formed. In one or more embodiments, the thermoplastic material forming the member 110 can have a melting point of from about 50° C. to about 250° C.; from about 60° C. to about 240° C.; or from about 60° C. to about 150° C. In one or more embodiments, the thermoplastic material forming the member can have a thickness of from about 0.1 mm to about 3 mm; about 0.1 mm to about 2 mm, or about 0.1 mm to about 1 mm.

In one or more embodiments, one or more apertures 170 can be disposed in, on, about, or through the member 110. The one or more apertures 170 can have any shape or configuration. The periphery or circumference defining the one or more apertures 170, or defined by the one or more apertures 170, can have one or more interior edges 150. The one or more apertures 170 can be disposed in, on, about, or through the member 110 to facilitate the passage, insertion, or installation of one or more fasteners such as screws, pins, and/or latches; accessories such as electronic components, batteries, peripheral devices, and the like through the EMI shield 110.

In one or more embodiments, a conductive layer 160 can be partially or completely disposed on or about the member 110. In one or more embodiments, the conductive layer 160 can contain one or more conductive metals or conductive metal containing alloys. In one or more specific embodiments, the conductive layer 160 can encapsulate the member 110, completely covering the first side 120, the second side 130, the at least one edge 140, and the one or more internal edges 150. In one or more embodiments, all or a portion of the conductive layer 160 can be chemically or mechanically bonded or otherwise attached to all or a portion of the member 110. In one or more embodiments, all or a portion of the conductive layer 160 can be deposited or otherwise applied to all or a portion of the member 110 via one or more electroplating or electroless plating processes. In one or more embodiments, the conductive layer 160 can include, but is not limited to, one or more metals or metal alloys including, but not limited to, copper and cuprous alloys, nickel and nickel alloys, silver and silver alloys, gold and gold alloys, aluminum and aluminum alloys, and the like. In one or more embodiments, the conductive layer 160 can have a thickness of from about 0.1 microns to about 200 microns; from about 0.1 microns to about 100 microns; or from about 0.1 microns to about 50 microns.

"Electroless plating" as used herein refers to an auto-catalytic chemical process used to deposit a layer of conductive material, for example a nickel-phosphorus or nickel-boron alloy on a solid substrate, for example the member 110. Electroless plating differs from electroplating in that electroless plating does not require a conductive substrate to promote the deposition of one or more conductive metals onto the substrate. Electroless plating can advantageously apply a near uniform conductive coating on a substrate, including edges and internal corners. Typical specifications for the application of conductive layers 160 via electroless plating include, but are not limited to, AMS-2404, AMS-C-26074, ASTM B-733, ASTM B-656, and MIL-DTL-32119.

In one or more embodiments, the EMI shield 100 depicted in FIGS. 1A and 1B can be fabricated by thermoforming a member 110 using one or more molds or masters. In one or more specific embodiments, the one or more molds or masters can include, but are not limited to, one or more electronic enclosures, for example a laptop or portable enclosure suitable for housing a computing device. In one or more specific embodiments, the one or more molds or masters can include, but are not limited to, a laptop computer base, a laptop computer display, a laptop computer switch cover, a laptop computer keyboard deck, or the like.

In one or more embodiments, one or more apertures 170 can be disposed on or about the member 110. The one or more apertures 170 can be of any size or frequency, for example one or more apertures 170 can be sized and located to provide access to a battery disposed on one side of the EMI shield 100, while a second aperture 170 can be sized and located to provide ventilation to one or more electronic devices disposed on one side of the EMI shield 100. In one or more embodiments, a conductive layer 160 can then be applied to the member 110, having the one or more apertures 170 disposed therein. In one or more specific embodiments, the conductive layer 160 can be applied using electroless plating as discussed in greater detail above.

Figure 2A:
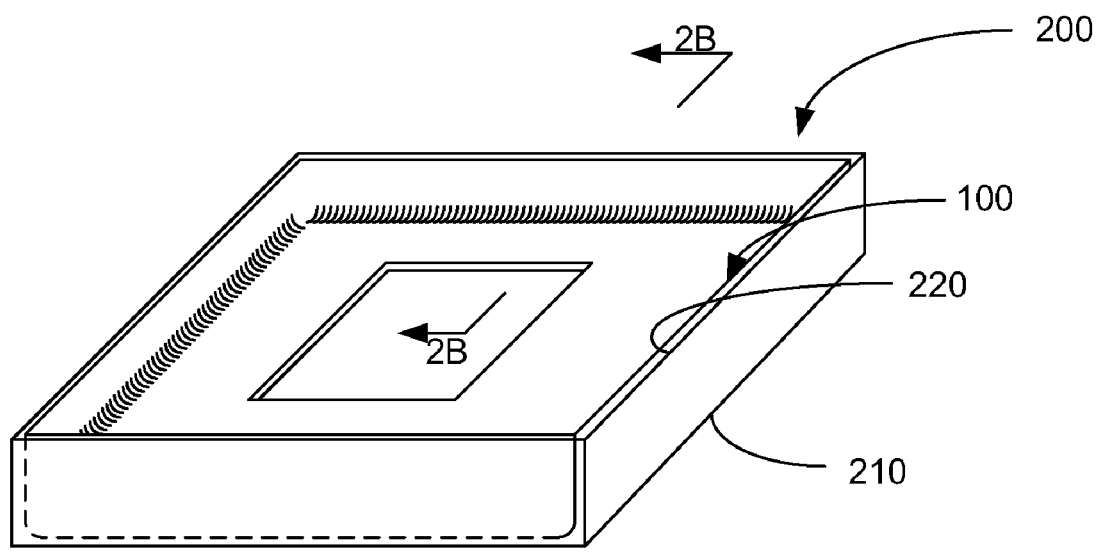
FIG. 2A is a perspective view depicting an illustrative system for minimizing the transmission and reception of electromagnetic interference ("EMI") disposed within an illustrative electronic enclosure, according to one or more embodiments described herein.
Figure 2B:
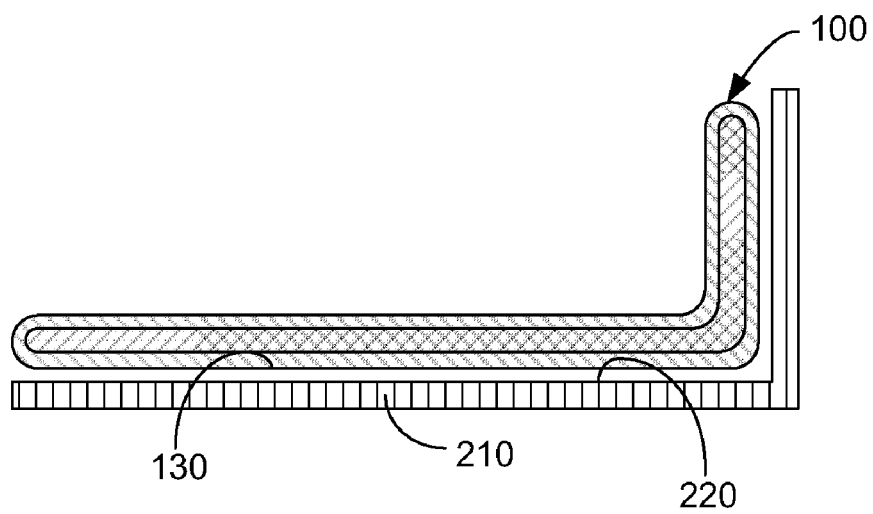
FIG. 2B is a partial cross-sectional view along line 2B-2B of the illustrative system for minimizing the transmission and reception of electromagnetic interference ("EMI") depicted in FIG. 2A, according to one or more embodiments described herein.

FIG. 2A is a perspective view depicting an illustrative system 200 for minimizing the transmission and reception of electromagnetic interference ("EMI"), according to one or more embodiments. FIG. 2B is a partial cross-sectional view along line 2B-2B of the illustrative system 200 depicted in FIG. 2A, according to one or more embodiments. In one or more embodiments, the illustrative EMI shield 100 depicted in FIGS. 1A and 1B can be partially or completely disposed in, on, or about an enclosure 210. In one or more embodiments, the enclosure 210 can include, but is not limited to, an enclosure for at least partially housing a computing device, for example a portable, laptop, ultraportable, or netbook computer, or the like. In one or more embodiments, the enclosure 210 can include, but is not limited to, an enclosure for at least partially housing a handheld computing device, for example a portable digital assistant (PDA), a cellular telephone, or the like.

The enclosure 210 can be any device, system, or combination of systems and/or devices suitable for the partial or complete disposal of one or more electronic devices therein. In one or more embodiments, the enclosure 210 can be a single component of a multi-component enclosure, for example the base portion of a hinged or pivotable multi-member enclosure suitable for housing a laptop computer, cellular telephone, and the like. Similarly, the lid portion and keyboard deck portions of a multi-member enclosure suitable for housing a laptop computer can also be independently considered an enclosure 210. In one or more embodiments, the member 110 can be formed using either pressure or vacuum forming to correspond to one or more interior or exterior surfaces of the enclosure 210.

The enclosure 210 can be manufactured or fabricated using any non-conductive material. Most frequently, the enclosure 210 can be fabricated using one or more nonconductive plastics and polymers transparent to radio frequency ("RF") transmissions. As depicted in FIG. 2B, in one or more embodiments, the second side 130 of the EMI shield 100 can be disposed proximate the inner surface 220 formed by the enclosure 210. In one or more specific embodiments, the EMI shield can partially or completely cover the interior surface 220 of the enclosure 210.

Figure 3A:
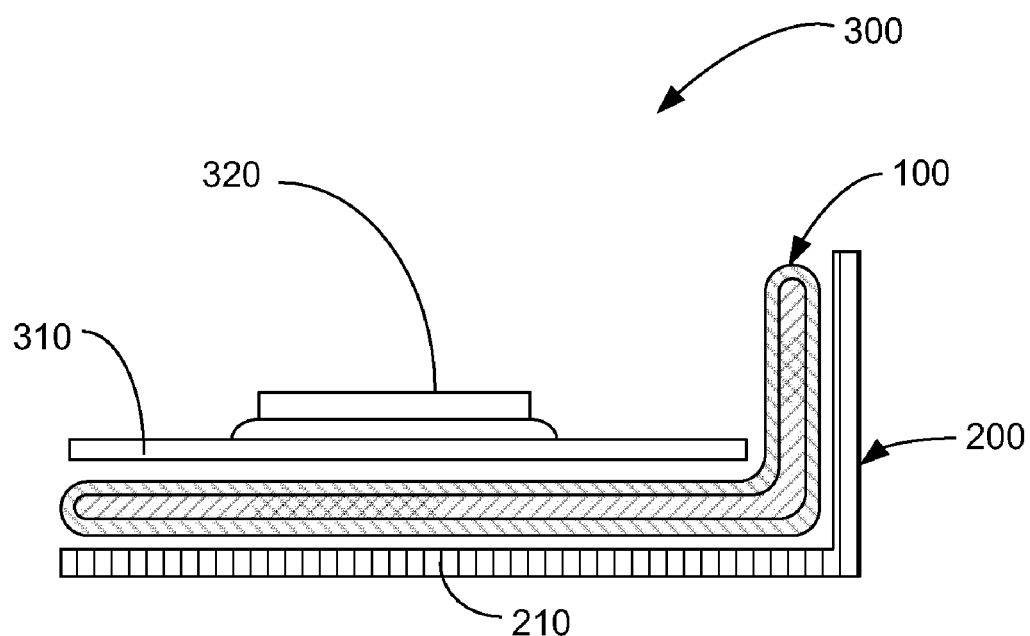
FIG. 3A is a partial cross-sectional view of an illustrative system 300 for isolating one or more illustrative surface mount components 320 from EMI using the illustrative system 200 depicted in FIG. 2A, according to one or more embodiments described herein.

FIG. 3A is a partial cross-sectional view of an illustrative system 300 for isolating one or more circuit boards 310 having one or more surface mount components 320 from electromagnetic interference using the illustrative system 200 depicted in FIG. 2A, according to one or more embodiments. In one or more embodiments, one or more circuit boards 310 having one or more surface mount components 320 can be disposed proximate the interior surface 120 of the EMI shield 100. In one or more embodiments, the circuit board 310, surface mount component 320 and the EMI shield 100 can be disposed in, on, or about an enclosure 210. In one or more specific embodiments, the circuit board 310 can be a motherboard or daughterboard for a computing device, the surface mount component 320 can be a processor, for example a central processing unit (CPU) or graphical processing unit (GPU) disposed at least partially within a laptop base enclosure 210. In one or more embodiments, the system 300 depicted in FIG. 3A can be used to isolate the circuit board 310 and surface mount component 320 from EMI surrounding the enclosure 210. Similarly, in one or more embodiments, the system 300 depicted in FIG. 3A can be used to isolate the area around the enclosure 210 from EMI generated by the circuit board 310 and/or surface mount component 320.

Figure 3B:
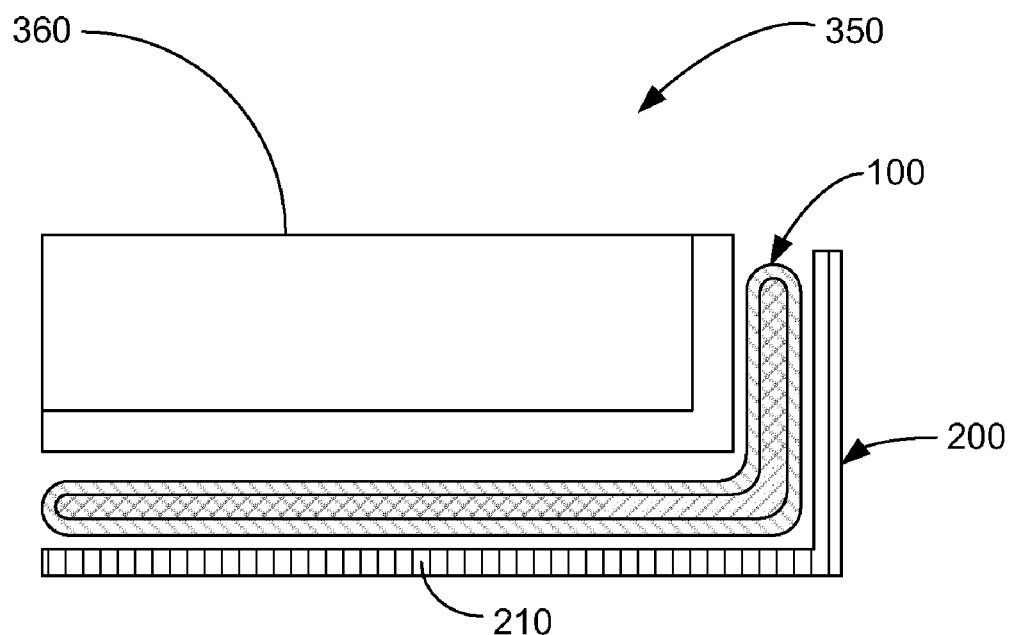
FIG. 3B is a partial cross-sectional view of an illustrative system 350 for isolating one or more illustrative display devices 360 from EMI using the illustrative system 200 depicted in FIG. 2A, according to one or more embodiments described herein.

FIG. 3B is a partial cross-sectional view of an illustrative system 350 for isolating one or more illustrative display devices 360 from electromagnetic interference using the illustrative system 200 depicted in FIG. 2A, according to one or more embodiments. In one or more embodiments, a display device 360, for example a liquid-crystal display ("LCD") can be disposed proximate the interior surface 120 of the EMI shield 100. In one or more embodiments, the display device 360 and the EMI shield 100 can be disposed in, on, or about an enclosure 210. In one or more specific embodiments, display device 360 can be a display device, for example a plasma, LCD, or LED display disposed at least partially within a laptop display enclosure 210. In one or more embodiments, the system 350 depicted in FIG. 3B can be used to isolate the display device 360 from EMI surrounding the enclosure 210. Similarly, in one or more embodiments, the system 350 depicted in FIG. 3B can be used to isolate the area surrounding the enclosure 210 from EMI generated by the display device 360.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application and for all jurisdictions in which such incorporation is permitted.

While the foregoing is directed to embodiments of the present invention, other and further embodiments of the invention may be devised without departing from the basic scope thereof, and the scope thereof is determined by the claims that follow.

What is claimed is:

1. An electromagnetic interference ("EMI") shield comprising:
a member having a first side, a second side and at least one edge;
wherein the member is formed to correspond to the interior of an enclosure;
wherein at least one aperture penetrating the member from the first side to the second side is disposed in, on, or about the member; and
wherein the at least one aperture penetrating the member forms at least one internal edge; and
a conductive layer disposed at least partially about the first side, the second side, the at least one edge, and the at least one internal edge of the member; and
wherein the conductive layer at least partially encapsulates the member.

2. The system of claim 1, wherein the member comprises a thermoplastic material having a thickness of from about 0.1 mm to about 1 mm.

3. The system of claim 1, wherein the enclosure comprises an electronic enclosure selected from the group of electronic enclosure consisting of: a laptop computer base, a laptop computer display, a laptop computer switch cover, and a laptop computer keyboard deck.

4. The system of claim 1, wherein the conductive layer comprises at least one metal; and wherein the conductive layer is applied to the member via an electroless plating process.

5. The system of claim 4, wherein the conductive layer applied via the electroless plating process has a thickness of from about 0.1 microns to about 50 microns.

6. A method for minimizing the transmission and reception of electromagnetic interference ("EMI") comprising:
   at least partially disposing an electronic component within a non-metallic enclosure; and
   at least partially interposing an EMI shield between the electronic component and the non-metallic enclosure, the EMI shield comprising:
      a member having a first side, a second side and at least one edge;
         wherein the member is formed to correspond to the interior of the non-metallic enclosure;
         wherein at least one aperture penetrating the member from the first side to the second side is disposed in, on, or about the member; and
         wherein the at least one aperture penetrating the member forms at least one internal edge; and
      a conductive layer disposed at least partially about the first side, the second side, the at least one edge, and the at least one internal edge; and
         wherein the conductive layer at least partially encapsulates the member.

7. The method of claim 6, wherein the electronic component comprises an electronic component selected from the group of electronic components consisting of: a printed circuit board having one or more surface-mount electronic components disposed thereupon, a display device, and a key-based data entry device.

8. The method of claim 6, wherein the non-metallic enclosure comprises a laptop computer base, a laptop computer panel display, a laptop computer key-based input device, an ultraportable computer base, an ultraportable computer panel display, an ultraportable computer key-based input device, a handheld computer, or a cellular telephone.

9. The method of claim 6, wherein the member comprises a thermoplastic material having a thickness of from about 0.1 mm to about 1 mm; and
   wherein the conductive layer comprises at least one metal applied to the member via an electroless plating process.

10. A method for minimizing the transmission and reception of electromagnetic interference ("EMI") comprising:
   forming a member into a shape defined by the interior surfaces of an enclosure;
      wherein the member comprises a first side, a second side and at least one edge;
   disposing one or more apertures in, on, or about the member;
      wherein the one or more apertures penetrate from the first side to the second side of the member;
      wherein the at least one aperture penetrating the member forms at least one internal edge; and
   at least partially encapsulating the member within a conductive layer;
      wherein the conductive layer is at least partially disposed on or about the first side, the second side, the at least one edge, and the at least one internal edge of the member.

11. The method of claim 10, wherein the forming of the member into the shape defined by the interior surfaces of the enclosure comprises: vacuum-forming the member into the shape defined by the interior surfaces of the enclosure or thermo-forming the member into the shape defined by the interior surfaces of the enclosure.

12. The method of claim 10, wherein the member comprises a thermoplastic material having a thickness of from about 0.1 mm to about 1 mm.

13. The method of claim 10, wherein the enclosure comprises an electronic enclosure selected from the group of electronic enclosures consisting of: a laptop computer base, a laptop computer display, a laptop computer switch cover, and a laptop computer keyboard deck.

14. The method of claim 10, wherein the conductive layer comprises at least one metal, or at least one metal alloy; and wherein the conductive layer is applied to the member via an electroless plating process.

15. The method of claim 14, wherein the conductive layer applied via the electroless plating process has a thickness of from about 0.1 microns to about 50 microns.

* * * * *